United States Patent [19]

Ishigami

[11] Patent Number: 5,166,750
[45] Date of Patent: Nov. 24, 1992

[54] FIBER OPTIC GYRO
[75] Inventor: Motohiro Ishigami, Tokyo, Japan
[73] Assignee: Japan Aviation Electronics Industry Limited, Tokyo, Japan
[21] Appl. No.: 808,872
[22] Filed: Dec. 18, 1991
[30] Foreign Application Priority Data Dec. 26, 1990 [JP] Japan .................................. 2-406826

[51] Int. Cl.$^5$ ............................................. G01C 19/64
[52] U.S. Cl. ..................................................... 356/350
[58] Field of Search ........................................ 356/350

[56] References Cited

U.S. PATENT DOCUMENTS 5,116,129  5/1992  Ishigami ............................. 356/350

Primary Examiner—Vincent P. McGraw
Attorney, Agent, or Firm—Pollock, VandeSande and Priddy

[57] ABSTRACT

Between clockwise and counterclockwise light beams having spent a time $\tau$ in propagating through a loop-shaped optical transmission line are provided phase differences $\pm \pi/2$ rad alternately at intervals of a time $k\tau$ in accordance with a biasing signal. Light of interference between the clockwise and counterclockwise light beams is converted to an electric signal corresponding to the intensity of the interference light. A step value signal for phase negative feedback is derived from a synchronously detected output and the step value is accumulated by an accumulator. When the accumulated output exceeds a threshold value corresponding to $2m\pi$ rad, the accumulator outputs the overflow value as the accumulated result and, at the same time, outputs an overflow signal and an overflow sign signal representing its polarity. The accumulated output is converted by a D/A converter to an analog signal, by which an optical phase modulator is driven. A control signal generator outputs a 0 when the overflow signal is zero, outputs $-1$ when supplied with a positive overflow signal, and outputs $+1$ when supplied with a negative overflow signal. The output of the control signal generator is applied to a multiplier. The level difference between the outputs of a synchronous detector before and after the biasing signal is changed over at the $k\tau$ time intervals is detected by a conversion error detector. The detected output is applied to the multiplier, wherein it is multiplied by the control signal from the control signal generator. The multiplied output is integrated by an integrator and the integrated output is used to control the conversion gain of the D/A converter by a negative feedback, thereby compensating for a change in the conversion gain of the optical phase modulator.

9 Claims, 10 Drawing Sheets

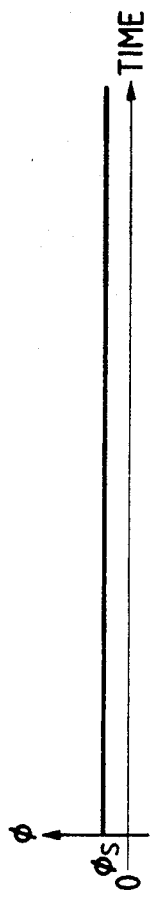
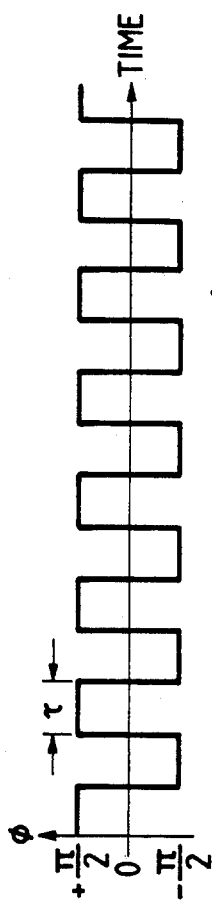
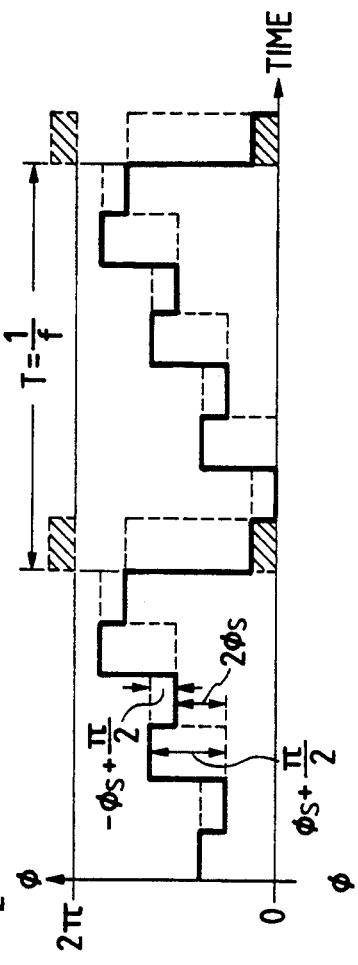
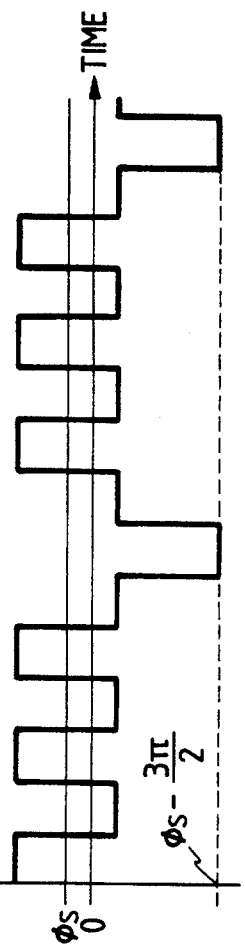
FIG. 3A PRIOR ART
FIG. 3B PRIOR ART
FIG. 3C PRIOR ART
FIG. 3D PRIOR ART

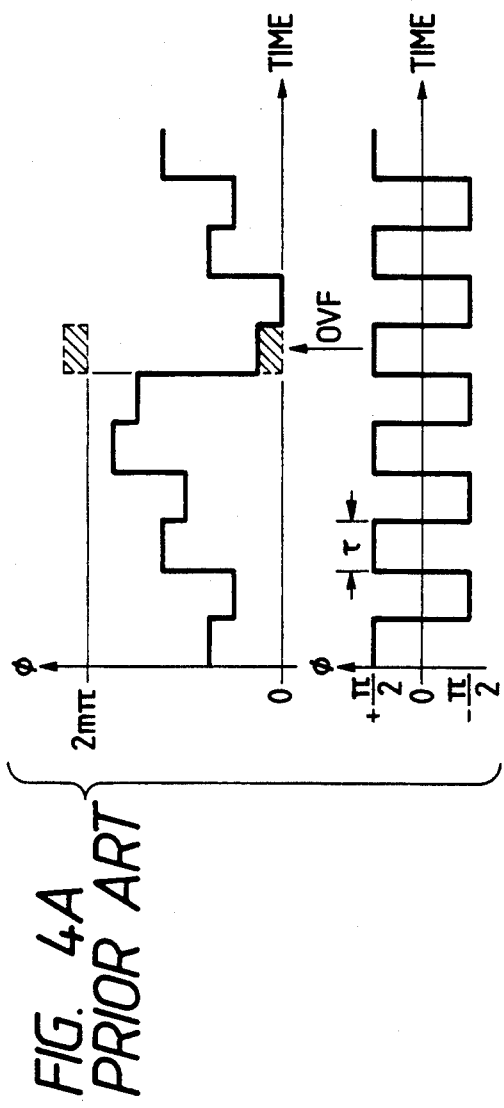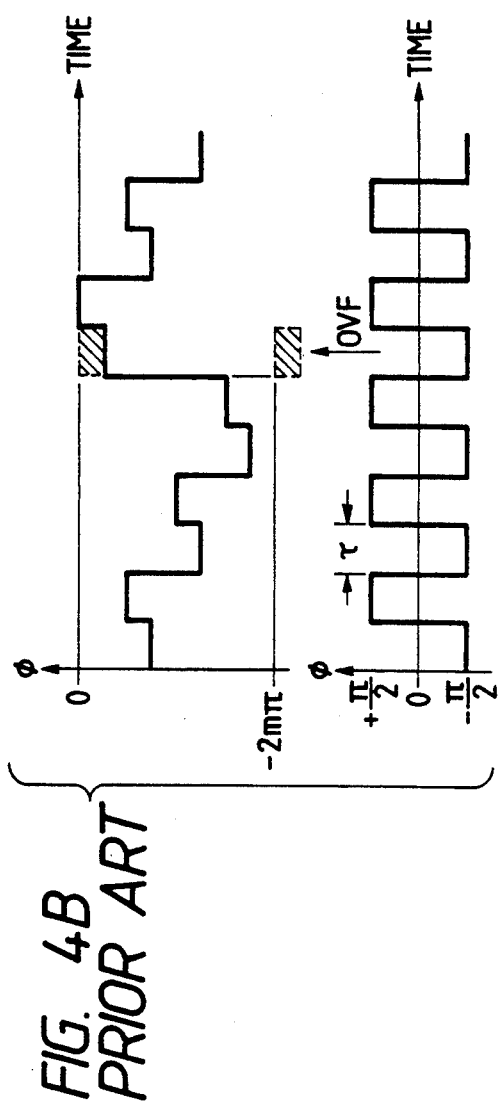
FIG. 4A PRIOR ART
FIG. 4B PRIOR ART

FIG. 7

TABLE 1

| PREVIOUS OP POINT | CVF | OSS | SC | $\phi_B$ | PRESENT OP POINT | $\phi_B \times \Delta I$ | $\Delta G$ | FC=SC×$\Delta G$ |
|---|---|---|---|---|---|---|---|---|
| B | 0 | x | 0 | x | A | x | x | 0 |
| A | | | | | B | | | |
| B | 1 | 0 | −1 | $+\frac{\pi}{2}$ | G | + | + | − |
| | | | | | E | − | − | + |
| A | 1 | 0 | −1 | $-\frac{\pi}{2}$ | L | − | − | + |
| | | | | | N | + | + | − |
| A | 1 | 1 | +1 | $-\frac{\pi}{2}$ | H | − | − | − |
| | | | | | F | + | + | + |
| B | 1 | 1 | +1 | $+\frac{\pi}{2}$ | K | + | + | + |
| | | | | | M | − | − | − |

FIBER OPTIC GYRO

BACKGROUND OF THE INVENTION

The present invention relates to a digital phase ramp type fiber optic gyro in which light is propagated clockwise and counterclockwise through a loop-shaped optical transmission line, a ramp signal which provides a stepwise ramp phase which cancels a phase difference between the clockwise and counterclockwise light beams which is caused by an angular rate applied to the optical transmission line and a biasing signal which provides phase differences $+\pi/2$ rad and $-\pi/2$ rad alternately between the both light beams are produced and the input angular rate is detected, based on the step size or frequency of the ramp signal.

FIG. 1 schematically shows a conventional digital phase ramp type fiber optic gyro. A light beam emitted from a light source 11 such as a laser is split by a beam splitter 12 into two beams, which are supplied to both ends of a loop-shaped optical transmission line formed by, for example, a plane-of-polarization retaining optical fiber coil, and are propagated therethrough as clockwise and counterclockwise beams 14 and 15. The beams 14 and 15 thus propagated through the optical transmission line 13 and emitted therefrom are coupled again by the beam splitter 12 and interfere with each other. The resulting interference light is transduced by an opto-electric transducer 16 into an electric signal corresponding to the intensity of the interference light, and the electric signal is amplified by an AC amplifier 17. An optical phase modulator 18 is interposed between the beam splitter 12 and the optical transmission line 13.

Now, let the time necessary for the propagation of the light from the light source 11 through the optical transmission line 13 be represented by $\tau$. A digital biasing signal generator 19 generates a digital biasing signal $\phi_B$ of such digital values that cause to add phase differences $+\pi/2$ rad and $-\pi/2$ rad alternately to a phase difference between the both light beams 14 and 15 when they are coupled or combined by the beam splitter 12, at time intervals of $k\tau$ (where k is a predetermined desired odd number, the following description being given of the case where $k=1$). In the following description the biasing phase differences $+\pi/2$ rad will also be indicated by the same reference notation $\phi_B$ as that used for the biasing signal. The output of the AC amplifier 17 is synchronously detected by a synchronous detector 22 using the biasing signal $\phi_B$ as a reference signal and the detected output is used to generate a digital step value $\phi_B$ by a step value generator 28. The digital biasing signal $\phi_B$ is added to the digital step value $\phi_s$ in an adder 32, and the added output is accumulated by an accumulator 33 at $k\tau$ time intervals. The accumulated output of the accumulator 33 is converted by a D/A converter 21 into an analog signal, which is applied to the optical phase modulator 18.

The relationship between the phase difference $\Delta\phi$ between the both light beams 14 and 15 when they are coupled together and the output level I obtained by amplifying the transduced electric signal corresponding to the intensity of the interference light, by the AC amplifier 17 is such as indicated by the curve 23 in FIG. 2. With no angular rate being applied to the optical transmission line 13 around its axis, the phase difference $\Delta\phi$ between the clockwise and counterclockwise light beams 14 and 15 varies about a zero phase by $\pi/2$ in positive and negative directions at $k\tau$ ($k=1$) time intervals owing to the modulation by the optical phase modulator 18, and the output level of the AC amplifier 17 becomes constant as indicated by the line 25, reducing the output of the synchronous detector 22 to zero.

When an angular rate is applied to the optical transmission line 13 around its axis, however, a phase difference $\phi_r$ (hereinafter referred to as a Sagnac phase shift) is introduced, by the Sagnac effect, between the clockwise and counterclockwise light beams 14 and 15 in accordance with the direction and magnitude of the input angular rate. Owing to the influence of the Sagnac phase shift $\phi_r$, the phase difference $\Delta\phi$ between the light beams 14 and 15 varies about a phase displaced $\phi_r$ from the zero phase by the same amount in positive and negative directions at $k\tau$ time intervals as indicated by the curve 26. Consequently, the output level of the AC amplifier 17 at that time becomes a rectangular wave whose level goes up and down at $k\tau$ time intervals as indicated by the curve 27, and the rectangular wave becomes in phase or 180° out of phase with the digital biasing signal $\phi_B$ of a 50% duty from the digital biasing signal generator 19, depending on the polarity of the Sagnac phase shift $\phi_r$. Hence, the level and polarity of the detected output obtained by synchronously detecting the output of the AC amplifier 17 with the synchronous detector 22 correspond to the magnitude and direction of the input angular rate. The synchronously detected output is used by the step value generator 28 to produce a negative feedback signal (a step value signal) $\phi_s$ which will reduce the output of the synchronous detector 22 to zero. Thus, the output of the synchronous detector 22 is representative of a negative phase feedback error. The step value generator 28 comprises a PID (proportional plus integral plus derivative) filter or similar analog calculator 29 which is supplied with the output of the synchronous detector 22 and an A/D converter 31 which converts the output of the analog calculator 29 to a digital signal. In the state of equilibrium by the negative feedback of the step value signal $\phi_s$ the magnitude and direction of the input angular rate can be known from the value and polarity of the step value signal $\phi_s$, because it has a magnitude and polarity by which the phase difference $\phi_r$ introduced between the clockwise and counterclockwise light beams 14 and 15 by the Sagnac effect can be cancelled. In the following description the step phase difference which is provided by the step value signal $\phi_s$ will also be identified by the same reference notation $\phi_B$.

The step value $\phi_s$ such as shown in FIG. 3A and the digital biasing signal $\phi_B$ such as shown in FIG. 3B are added together by the adder 32 as mentioned above and the added output is accumulated by the accumulator 33 at the $k\tau$ time intervals. The accumulated output becomes as indicated by the solid line in FIG. 3C. The output of the accumulator 33 is converted by a D/A converter 21 to an analog value, which is applied as a modulation signal to the optical phase modulator 18.

The phase shifts of the clockwise and counterclockwise light beams 14 and 15 having returned to the beam splitter 12, caused by the optical phase modulator 18, are such as indicated by the solid line and the broken line in FIG. 3C, since the clockwise light beam 14 lags the beam 15 by the propagation time $\tau$. Consequently, the phase difference $\Delta\phi$ between the both beams 14 and 15 is the sum of the step value signal $\phi_s$ and the biasing signal $\phi_B$ as shown in FIG. 3D. Hence, by controlling the step value $\phi_s$ so that the output of the synchronous detector 22 may be reduced to zero, the step value $\phi_s$ will become equal to the Sagnac phase shift $\phi_r$ caused by the input angular rate. The Sagnac phase shift $\phi_r$ is expressed by the following equation:

$$\phi_r = 4\pi RL\Omega/(\lambda C) \qquad (1)$$

where R is the radius of the optical transmission line 13, L the length of the optical transmission line (an optical fiber) 13, $\lambda$ is the wavelength of emitted light from the light source 11, C is the velocity of light in a vacuum and $\Omega$ is the input angular rate.

Therefore, $$\Omega = \phi_r \lambda C/(4\pi RL) = \phi_s \lambda C/(4\pi RL) \qquad (2)$$

By obtaining the step value $\phi_s$ based on the relationship between the electric signal applied to the optical phase modulator 18 and the resulting phase shift amount and substituting the step value into Eq. (2), the input angular rate $\Omega$ can be obtained.

In practice, however, it is convenient to obtain the input angular rate $\Omega$ in such a manner as mentioned below. The accumulator 33 outputs an overflow value as its accumulated value when the absolute value of the accumulated value is in excess of a predetermined threshold value corresponding to $2m\pi$ rad (where m is usually a positive integer, and FIGS. 3C and 3D show the case where m=1). Letting the number of accumulations between an overflow and the next overflow and the period of the overflow be represented by p and T, respectively, $$\phi_s = 2m\pi/p, \; p = T/\tau$$

because of the following relationships:

$$p\phi_s = 2m\pi, \; p\tau = T \equiv 1/f.$$

Hence, $$\phi_s = 2m\pi\tau/T = 2m\pi\tau f \qquad (3)$$

Substitution of Eq. (3) into Eq. (2) gives $$\Omega = \lambda C \cdot m\tau f/2RL \qquad (4)$$

Since $\tau = nL/C$ (where n is the refractive index of the optical transmission line 13), its substitution into Eq. (4) gives $$\Omega = \lambda n \cdot mf/2R \qquad (5)$$

By measuring the frequency f of the overflow of the accumulator 33, the input angular rate $\Omega$ can be obtained. In the case where the digital biasing signal $\phi_B$ corresponding to $\pm \pi/2$ is not applied to the adder 32, the output of the accumulator 33 varies stepwise in the positive or negative direction depending on the polarity of the step value signal $\phi_s$ in the intervals of overflows; hence, the output of the accumulator 33 will hereinafter be referred to as a positive or negative digital ramp signal.

If the input angular rate is not so large as to cause a phase shift $\phi_r = \phi_s$ in excess of $\pm \pi/2$ rad (i.e. if $|\phi_s| < \pi/2$), an overflow occurs when the step value $\phi_s$ is positive and the biasing signal $\phi_B$ is $+\pi/2$ rad as indicated by an arrow OVF in FIG. 4A or when the step value $\phi_s$ is negative and the biasing signal $\phi_B$ is $-\pi/2$ rad as shown in FIG. 4B. In this instance, the phase difference $\Delta\phi$ becomes $\pm(2m\pi - \pi/2) + \phi_s$. In the steady state of the negative feedback operation, since the step value $\phi_s$ is cancelled by the Sagnac phase shift $\phi_r$, the intensity of interference light which is observed in the opto-electric transducer 16 is the intensity at positions where the phase difference $\Delta\phi$ between the both light beams 14 and 15 is $\pm(\pm(2m\pi - \pi/2 \text{ rad})$. Setting m=1, the phase difference $\pm 3\pi/2$, which correspond to operation points C and D in FIG. 5. The phase differences $\Delta\phi$ when no overflow occurs are $\pm \pi/2$, which correspond to operation points A and B. In short, in the steady state of the negative feedback operation the intensity of interference light which is observed in opto-electric transducer 16 is constant, ideally, irrespective of the occurrence of an overflow.

The threshold value of the accumulator 33 is set to correspond to the phase shift amount $2m\pi$ rad by the optical phase modulator 18 as referred to previously, but the conversion gain of the optical phase modulator 18 varies with temperature and similar ambient conditions. In consequence, the phase shift amount by the optical phase modulator 18, corresponding to the threshold value of the accumulator 33, deviates from the above-mentioned value $2m\pi$ rad. Since this deviation is equivalent to a deviation of the value of m from its integral value, the exact input angular rate $\Omega$ cannot be measured as will be seen from Eq. (5), for instance.

In the case where the conversion gain of the optical phase modulator 18 has become smaller than its initial value and in the state in which the Sagnac phase shift $\phi_r$ and the step value $\phi_s$ are cancelled each other, the absolute value of the phase difference between the both light beams 14 and 15 immediately after an overflow is smaller than $(2m\pi - \pi/2)$ rad, and the interference light intensity detected by the opto-electric transducer 16 moves because of the overflow from the operation point A (or B) not to the operation point C (or D) but to the operation point E (or F) in FIG. 5 which is lower than the intensity at the operation point A (or B). Similarly, in the case where the conversion gain of the optical phase modulator 18 has become greater than its initial value and in the state where the Sagnac phase shift $\phi_r$ and the step value $\phi_s$ are cancelled each other, the absolute value of the phase difference $\Delta\phi$ between the both light beams 14 and 15 immediately after an overflow becomes larger than $(2m\pi - \pi/2)$ rad, and the intensity of the interference light which is observed in the opto-electric transducer 16 moves from the operation point A (or B) to the operation point G (or H), higher than the intensity at the operation point A (or B).

A conversion gain controller 35 compares, through utilization of such phenomena, output levels of the AC amplifier 17 is respective periods $\tau$ before and after the overflow and controls the conversion gain of the D/A converter 21 to increase or decrease, depending on whether the output after the overflow is smaller or larger than the output before the overflow. In this way, the conversion gain of the D/A converter 21 is corrected so that the threshold value of the accumulator 33 may always correspond to the phase shift amount $2m\pi$ rad by the optical phase modulator 18. The conversion gain of the D/A converter 21 can be corrected by using a multiplying type D/A converter and applying thereto the output of the conversion gain controller 35 as a multiplication signal.

In the above-described digital phase ramp type fiber optic gyro, when a large angular rate which will cause a phase shift greater than $\pi/2$ rad in absolute value is input thereinto, an overflow occurs when the ramp signal is positive and the biasing signal $\phi_B$ is $-\pi/2$ (or when the ramp signal is negative and the biasing signal $\phi_B$ is $+\pi/2$, and the operation point may sometimes jump from B (or A) to J (or I) where the phase difference $\Delta\phi$ between the clockwise and counterclockwise light beams 14 and 15 is $-5\pi/2$ (or $+5\pi/2$) In other words, when an overflow occurs, the phase difference $\Delta\phi$ may sometimes becomes $\pm(2m\pi+\pi/2)$ rad, in general.

In this case, if the conversion gain of the optical phase modulator 18 becomes smaller than its initial value, the absolute value of the phase difference $\Delta\phi$ immediately after the overflow becomes smaller than $(2m\pi+\pi/2)$ rad and the intensity of the interference light which is observed in the opto-electric transducer 16 is the intensity at the operation point L (or K), higher than the intensity of the interference light at the operation point B (or A). As a result, the output after the overflow becomes larger than the output before the overflow. If the conversion gain of the D/A converter 21 is reduced by the conventional method, then the feedback will become positive, resulting in the absolute value of the phase difference immediately after the overflow becoming further smaller than $(2m\pi+\pi/2)$ rad.

Conversely, when the conversion gain of the optical phase modulator 18 has become larger than its initial value, the absolute value of the phase difference $\Delta\phi$ between the both light beams 14 and 15 immediately after the overflow becomes greater than $(2m\pi+\pi/2)$ rad and the intensity of the interference light which is observed in the opto-electric transducer 16 becomes the intensity at the operation point N (or M), lower than the intensity at the operation point B (or A). That is, the output after the overflow becomes smaller than the output before the overflow, increasing the conversion gain of the D/A converter 21. Consequently, a positive feedback takes place and the absolute value of the phase difference $\Delta\phi$ during the overflow becomes further greater than $(2m\pi+\pi/2)$ rad.

Generally speaking, when an input angular rate which causes a phase shift greater than $\pi/2$ rad in absolute value is input, the phase difference $\Delta\phi$ between the both light beams 14 and 15 immediately after the overflow may sometimes assume values of not only $\pm(2m\pi-\pi/2)$ rad but also $\pm(2m\pi+\pi/2)$ rad in the state of the Sagnac phase shift amount $\phi_r$ and the step value $\phi_s$ being cancelled each other, and in the latter case the correction control for a change in the conversion gain of the optical phase modulator 18 becomes a positive feedback, making it impossible to correctly detect the angular rate.

Also in the case where the optical phase modulation by the digital ramp signal and the optical phase modulation by the biasing signal are carried out independently of each other through use of individual optical phase modulators, the phase difference between the both light beams during an overflow may sometimes assume the values of $\pm(2m\pi+\pi/2)$ rad as well as $\pm(2m\pi-\pi/2)$ rad in the state of the Sagnac phase shift amount $\phi_r$ and the step value $\phi_s$ being cancelled each other, and in the former case the correction control for a change in the conversion gain of the optical phase modulator 18 cannot be achieved as is the case with the above.

SUMMARY OF THE INVENTION

It is therefore an object of the present invention to provide a digital ramp type fiber optic gyro which is capable of controlling the conversion gain of the optical phase modulator even if the input angular rate causes a phase shift larger than $\pi/2$ rad in absolute value between the clockwise and counterclockwise light beams.

According to the present invention, a step value, which is based on a phase negative feedback error detected by synchronous detection from interference light between clockwise and counterclockwise light beams having propagated through a loop-shaped optical transmission line, is accumulated by an accumulator at $k\tau$ (where k is a positive odd number) time intervals, and the accumulated output is converted by a D/A converter to an analog signal, by which an optical phase modulator is driven to control the phase difference between the clockwise and counterclockwise light beams to thereby reduce the phase negative feedback error to zero. A biasing signal, which provides phase differences $+\pi/2$ and $-\pi/2$ alternately between the clockwise and counterclockwise light beams at $k\tau$ time intervals, is produced by biasing signal generating means. In the case where the absolute value of the accumulated value is in excess of a threshold value corresponding to $2m\pi$ (where m is a positive integer), the overflow value is output as the accumulated output from the accumulator, and at the same time, an overflow signal indicating the occurrence of the overflow and an overflow sign signal indicating the polarity of the overflow are output. The accumulated output is converted by the D/A converter to an analog signal, which is applied as a modulation signal to the optical phase modulator. Further, a difference between output levels of a synchronous detector before and after the changeover of the biasing signal at the $k\tau$ time intervals is detected as a conversion error signal, which is multiplied by the sign value corresponding to the polarity of the overflow, and the multiplied output is used to control the conversion gain of the D/A converter to thereby compensate for a change in the conversion gain of the optical phase modulator.

BRIEF DESCRIPTION OF THE DRAWINGS

FIG. 3A is a timing chart showing an example of a step value $\phi_s$ which is generated by a step value generator 28;

FIG. 3B is a timing chart showing a digital biasing signal;

FIG. 3C is a timing chart indicating the phase shift amounts of the clockwise and counterclockwise light beams by solid and broken lines, respectively;

FIG. 3D is a timing chart showing an example of the phase difference $\Delta\phi$ between the clockwise and counterclockwise light beams;

FIG. 4A is a timing chart showing examples of the output of an accumulator 33 and the digital biasing signal in the case of a positive overflow;

FIG. 4B is a timing chart showing examples of the output of the accumulator 33 and the digital biasing signal in the case of a negative overflow;

FIG. 7 is a table for explaining a negative feedback operation of a conversion gain in the FIG. 6 embodiment;

DESCRIPTION OF THE PREFERRED EMBODIMENTS

Figure 1:
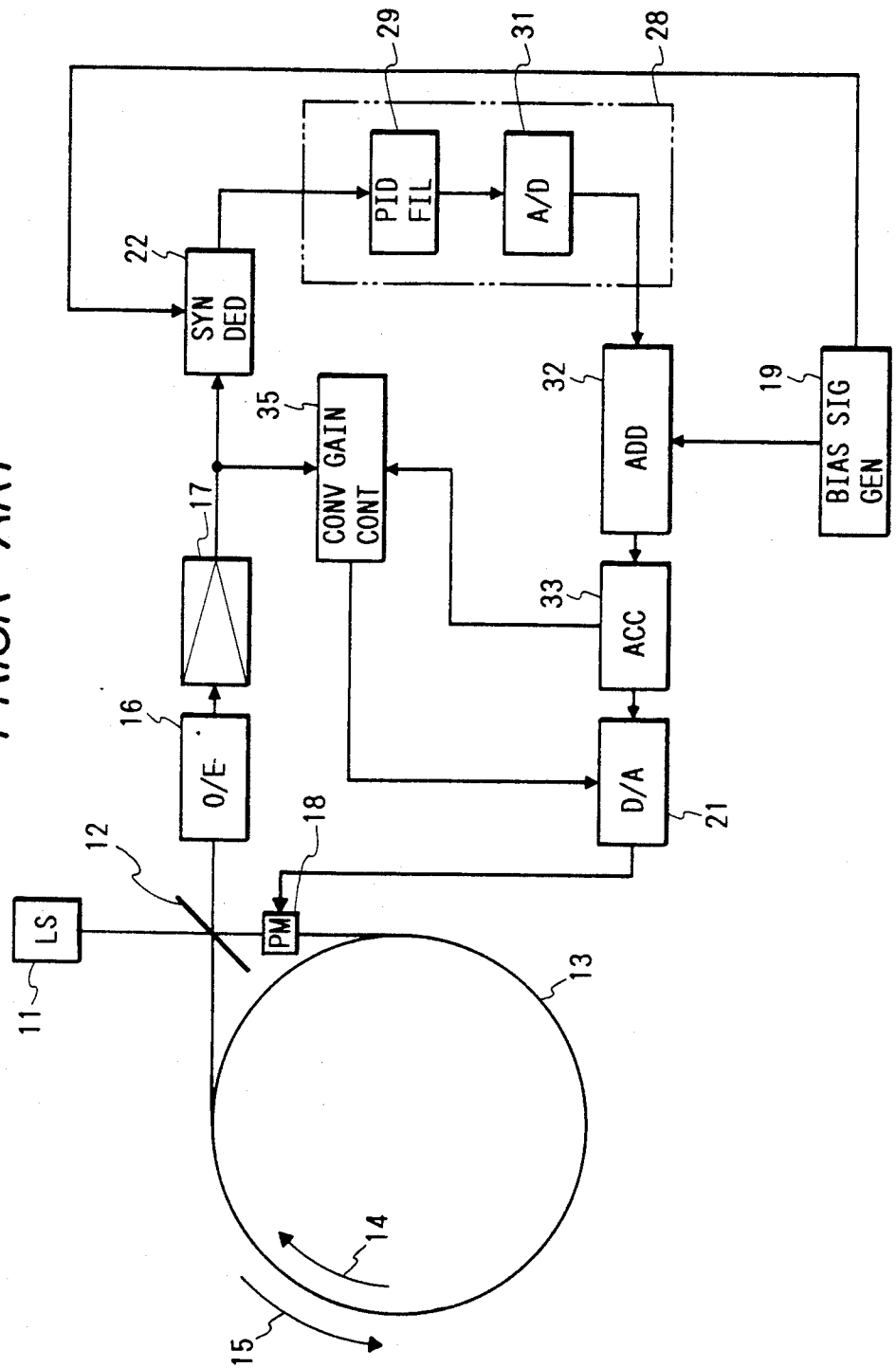
FIG. 1 is a block diagram showing a conventional digital phase ramp type fiber optic gyro.
Figure 2:
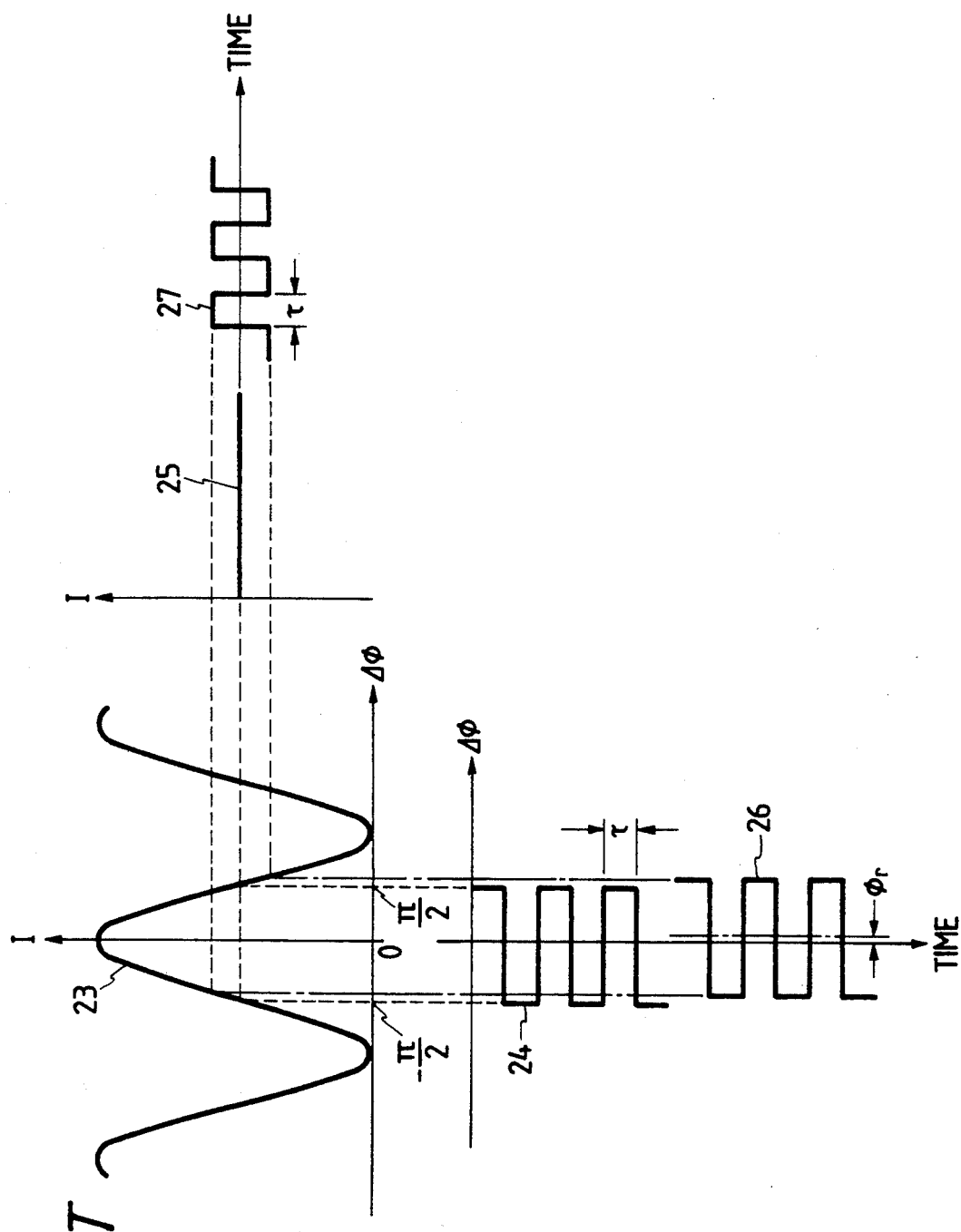
FIG. 2 is a diagram showing, by way of example, an output characteristic 23 of an opto-electric transducer 16 for the phase difference $\Delta\phi$ between clockwise and counterclockwise light beams and a change in the output of the opto-electric transducer 16 with a change in the phase difference $\Delta\phi$ by biasing.
Figure 6:
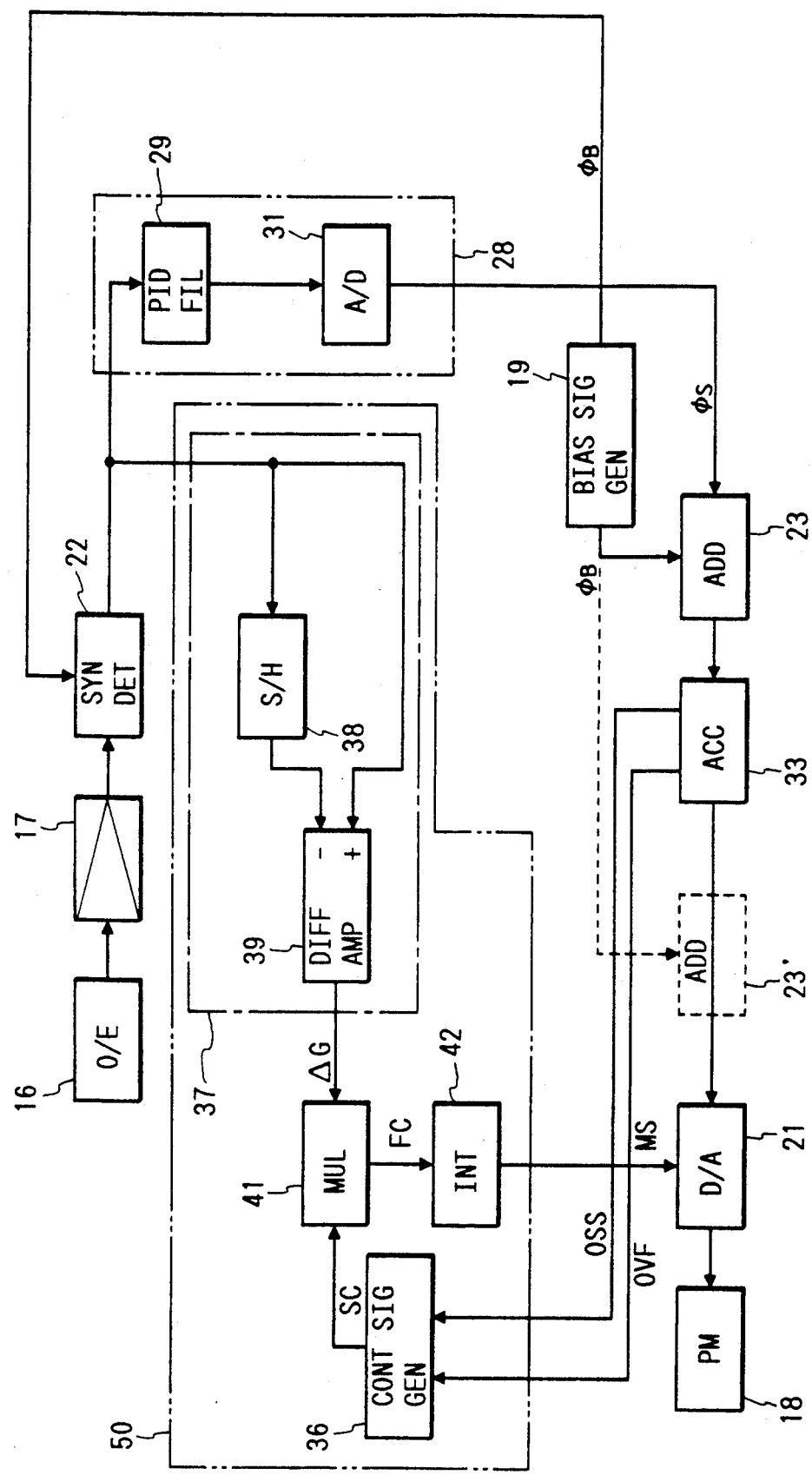
FIG. 6 is a block diagram illustrating an embodiment of the present invention.

A first embodiment is shown in FIG. 6, in which the parts corresponding to those in FIG. 1 are identified by the same reference numerals. In FIG. 6 the light source 11, the beam splitter 12 and the optical transmission line 13 are not shown.

The accumulator 33 is adapted so that when the absolute value of the accumulated value exceeds a predetermined threshold value corresponding to $2m\pi$ (where m is a positive integer), it provides the overflow value as the accumulated output and, at the same time, yields an overflow signal OVF indicating the occurrence of an overflow and an overflow sign signal OSS indicating the polarity of the overflow. The overflow signal OVF and the overflow sign signal OSS are applied to a control signal generator 36. The output of the synchronous detector 22 is applied to a conversion error detector 37 as well. The conversion error detector 37 is made up of sample-hold means 38 which performs sampling immediately before the polarity of the biasing signal $\phi_B$ which provides the phase difference $\pm\pi/2$ between the clockwise and counterclockwise light beams is changed over at the $k\tau$ time intervals, and a differential amplifier 39. The differential amplifier 39 outputs, as a conversion error signal $\Delta G$, the level difference between the detected outputs of the synchronous detector 22 in the current biasing state ($+\pi/2$ or $-\pi/2$ rad) and in the preceding biasing state ($-\pi/2$ or $+\pi/2$ rad). The conversion error signal $\Delta G$ is applied to a multiplier 41.

Based on the overflow signal OVF and the overflow sign signal OSS supplied thereto, the control signal generator 36 applies to the multiplier 41, as a sign control signal SC, 0 in the case of no overflow, $-1$ in the case of a positive overflow (OVF=1, OSS=0), or $+1$ in the case of a negative overflow (OVF=1, OSS=1). In the multiplier 41 the output $\Delta G$ of the conversion error detector 37 and the output SC of the control signal generator 36 are multiplied. The multiplied output FC is integrated by an analog integrator 42 and the integrated output is applied as a multiplication signal MS to the D/A converter 21. Thus, the conversion gain of the D/A converter 21 is controlled by the negative feedback. The conversion error detector 37, the control signal generator 36, the multiplier 41 and the analog integrator 42 constitute a conversion gain control circuit 50.

Next, a description will be given of the operation for controlling the conversion gain of the D/A converter 21. A DC component of the output from the opto-electric transducer 16 is blocked by the AC amplifier 17, providing zero level at each of the operating points A, B, C, D, I and J on the straight line CL in FIG. 5. The synchronous detector 22 performs the synchronous detection by multiplying the input signal by $+1$ in the case of $+\pi/2$ biasing and by $-1$ in the case of $-\pi/2$ biasing. When no overflow occurs, the output SC of the control signal generator 36 is 0 and the output FC of the multiplier 41 is 0. Consequently, the output level of the analog integrator 42 does not change and hence remains constant.

Figure 5:
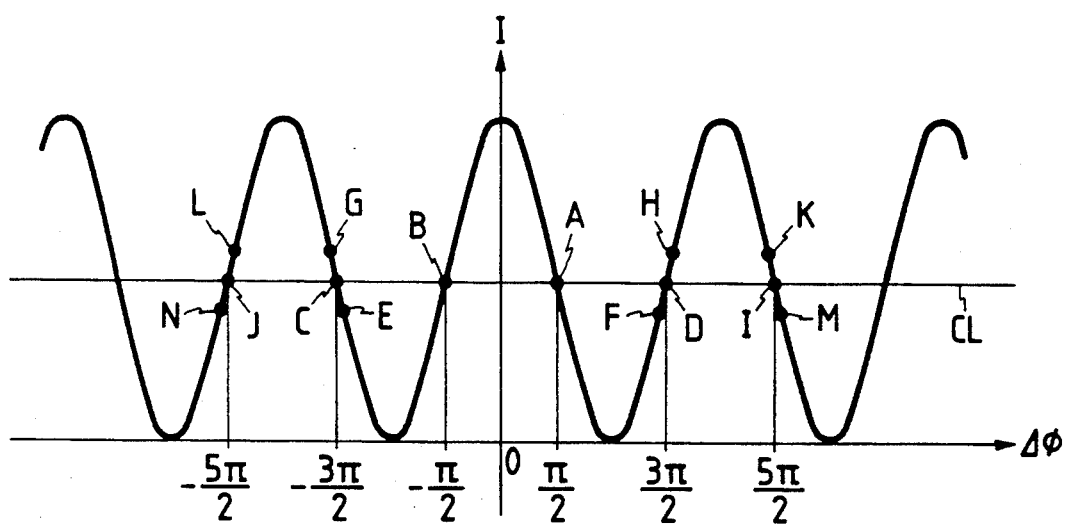
FIG. 5 is a diagram showing the relationship between the phase difference $\Delta\phi$ between the clockwise and counterclockwise light beams and the intensity of interference light which is observed at the output of the opto-electric transducer 16.

Case 1: Let it be assumed that in a positive digital ramp signal generating state (i.e. when the positive step value $\phi_s$ is being generated) the biasing signal $\phi_B$ from the digital biasing signal generator 19 changes from $-\pi/2$ to $+\pi/2$ and a positive overflow occurs at that time. If the conversion gain of the optical phase modulator 18 is of a predetermined value, the operating point will shift from B to C as the result of the overflow. If the conversion gain of the optical phase modulator 18 is smaller than the predetermined value, the absolute value of the phase difference $\Delta\phi$ between the both light beams 14 and 15 immediately after the overflow is smaller than $(2m\pi - \pi/2)$ rad (FIG. 5 showing the case of m=1) and the operating point shifts to E, for example. Consequently, a difference between the output of the sample-hold means 38 before the overflow, i.e. the output (substantially zero) obtained by the synchronous detection (a $-1$ multiplication) of the output of the AC amplifier 17 with respect to the $-\pi/2$ biasing signal $\phi_s$ at the operating point B, and the output (of a negative level) obtained by the synchronous detection (a $+1$ multiplication) of the output of the AC amplifier 17 with respect to the $+\pi/2$ biasing signal $\phi_B$ at the operating point E after the overflow is provided as the conversion error $\Delta G$ from the differential amplifier 39, and the output is negative. Since the overflow is positive, the sign control signal SC=$-1$ is multiplied by the output $\Delta G$ of the differential amplifier 39 in the multiplier 41 and the multiplied output FC is positive. The multiplied output is integrated by the analog integrator 42, and by the integrated output MS, the conversion gain of the D/A converter 21 is increased, thus performing a negative feedback operation whereby the phase difference $\Delta\phi$ between the both light beams 14 and 15 during the overflow becomes $-(2m\pi - \pi/2)$ rad.

Case 2: Let it be assumed that in the positive digital ramp signal generating state the biasing signal $\phi_B$ changes from $+\pi/2$ (the operating point A) to $-\pi/2$ and a positive overflow occurs at that time. If the conversion gain of the optical phase modulator 18 is of a predetermined value, the operating point will shift from A to J as a result of the overflow. If the conversion gain of the optical phase modulator 18 is smaller than the predetermined value, however, the absolute value of the phase difference $\Delta\phi$ between the both light beams 14 and 15 immediately after the overflow becomes smaller than $(2m\pi + \pi/2)$ and the operating point shifts to L, for example. Consequently, the difference between the output (substantially zero) of the sample-hold means 38 obtained by the synchronous detection of the output of the AC amplifier 18 with respect to the $+\pi/2$ biasing signal $\phi_B$ at the operating point A before the overflow and the output obtained by the synchronous detection of the AC amplifier 18 with respect to the $-\pi/2$ biasing signal at the operating point L after the overflow (the output of the AC amplifier at the operating point L is positive, but since it is multiplied by $-1$ by the synchronous detection, the detected output is of the negative level) is output as the conversion error signal $\Delta G$ from the differential amplifier 39. Hence, the conversion error output $\Delta G$ has a negative level. Since the overflow is positive, the output $\Delta G$ of the differential amplifier 39 is multiplied by the sign control signal $SC = -1$ in the multiplier 41 and the multiplied output FC has a positive level and is integrated by the analog integrator 42. The conversion gain of the D/A converter 21 is increased by the integrated output MS to perform the negative feedback operation whereby the phase difference $\Delta\phi$ between the both light beams 14 and 15 immediately after the overflow becomes $-(2m\pi + \pi/2)$ rad.

Case 3: In the case where the conversion gain of the optical phase modulator 18 is larger than its predetermined value, the biasing signal $\phi_B$ similarly changes from $-\pi/2$ to $+\pi/2$ (or from $+\pi/2$ to $-\pi/2$) in the positive digital ramp signal generating state and a positive overflow occurs, and when the operating point shifts from B (or A) to G (or N), the synchronously detected output becomes positive, and consequently, the conversion error output $\Delta G$ from the differential amplifier 39 becomes positive. Since the overflow is positive, the sign control signal $SC = -1$ is provided from the control signal generator 36 and is multiplied by the conversion error $\Delta G$ in the multiplier 41 and the resulting negative multiplied output is integrated by the analog integrator 42. The conversion gain of the D/A converter 21 is reduced by the integrated output MS.

Case 4: In the case where the conversion gain of the optical phase modulator 18 is larger than its predetermined value, the biasing signal $\phi_B$ changes from $+\pi/2$ to $-\pi/2$ to cause a negative overflow in a negative digital ramp signal generating state (i.e. when the step value $\phi_s$ is negative), and when the operating point shifts from A to F, the output of the synchronous detector 22 goes positive, making the conversion error output $\Delta G$ of the differential amplifier 39 positive. Since the overflow is negative, the control signal generator 36 applies the sign control signal $SC = +1$ to the multiplier 41. Consequently, the output FC of the multiplier 41 is positive, by which the conversion gain of the D/A converter 21 is increased and the phase difference $\Delta\phi$ between the both light beams 14 and 15 at the time of the overflow becomes $+(2m\pi + \pi/2)$ rad. In the negative digital ramp signal generating state, when biasing signal $\phi_B$ changes from $-\pi/2$ to $+\pi/2$ to cause the negative overflow and consequently the operating point shifts from B to K, the synchronously detected output by the $+\pi/2$ biasing signal $\phi_B$ at the operating point K has a positive level, and hence the output of the differential amplifier 39 goes positive. Since the overflow is negative, the control signal generator 36 provides the sign control signal $SC = +1$ to the multiplier 41, and consequently its output FC is positive, by which the conversion gain of the D/A converter 21 is increased and the phase difference $\Delta\phi$ between the both light beams 14 and 15 at the time of the overflow is controlled to be $+(2m\pi + \pi/2)$ rad.

Case 5: In the case where the conversion gain of the optical phase modulator 18 is larger than the predetermined value, when the biasing signal $\phi_B$ changes from $+\pi/2$ to $-\pi/2$ (or from $-\pi/2$ to $+\pi/2$) to cause a negative overflow and the operating point shifts from A to H (or M) in the negative digital ramp signal generating state, the synchronously detected output goes negative, and consequently, the conversion error output $\Delta G$ from the differential amplifier 39 goes negative. Since the overflow is negative, the control signal generator 36 outputs the sign control signal $SC = +1$ and the output FC of the multiplier 41 also goes positive, reducing the conversion gain of the D/A converter 21.

The above-described negative feedback operations are summarized in Table I of FIG. 7. In Table I, $\Delta I$ represents deviations of the output level of the AC amplifier 17 from the straight line CL at the operating points E, F, G, H, K, L, N, etc. shown in FIG. 5 and the polarities of the multiplied outputs are given in the column $\phi_B \times \Delta I$.

Figure 8:
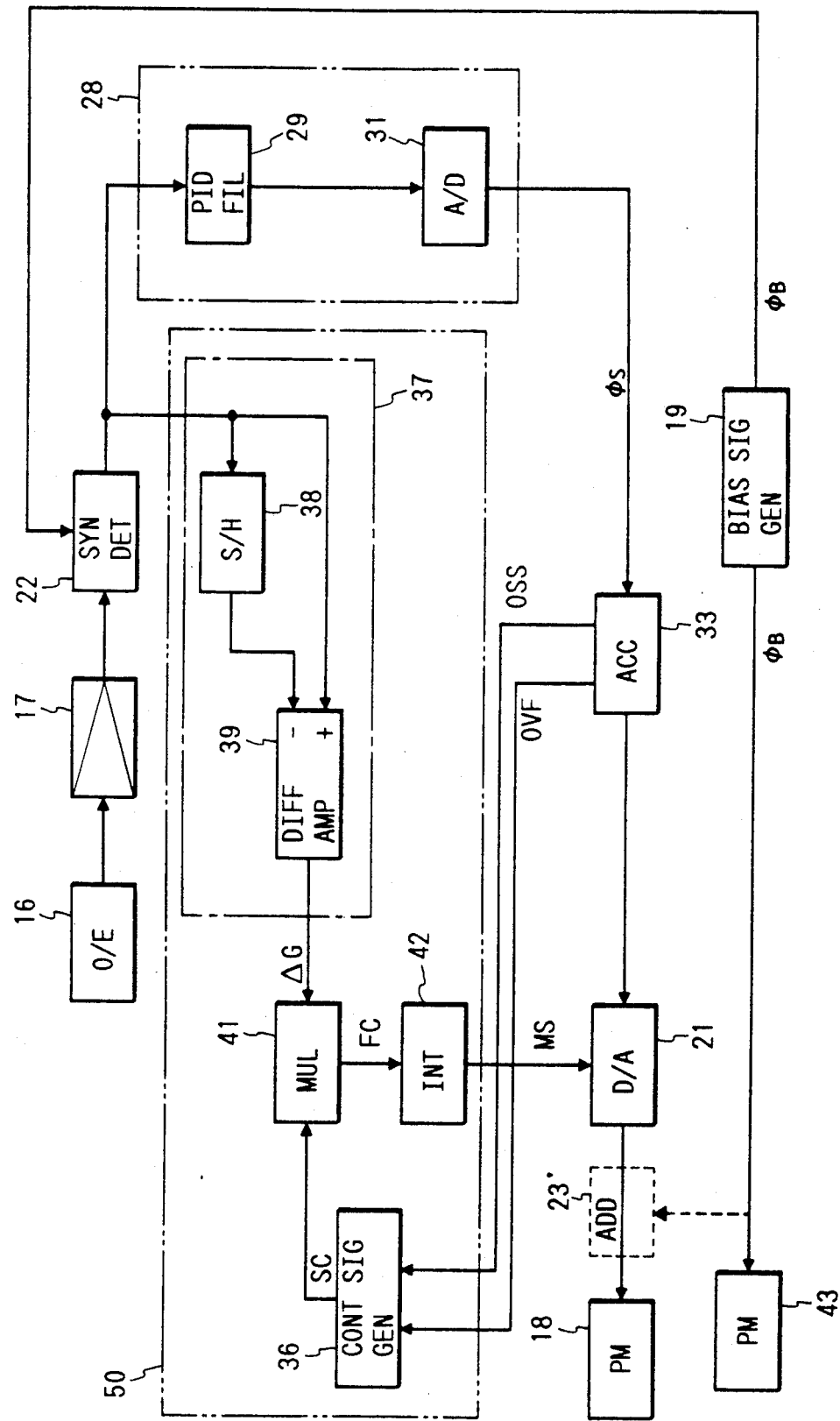
FIG. 8 is a block diagram illustrating a second embodiment of the present invention.

FIG. 8 illustrates a second embodiment of the present invention, which employs two optical phase modulators 18 and 43. Only the output step value of the step value generator 28 is accumulated by the accumulator 33 at the $k\tau$ time intervals and the accumulated output is converted by the D/A converter 21 to an analog signal, by which the optical phase modulator 18 is controlled. The biasing signal generator 19 generates an analog biasing signal $\phi_B$ which provides phase shifts $+\pi/4$ and $-\pi/4$ alternately at the $k\tau$ time intervals, and the biasing signal is used to control the optical phase modulator 18. The optical phase modulator 43 may be provided on the same side as the optical phase modulator 18 or between the other end of the optical transmission line 15 and the beam splitter 12.

Figure 9:
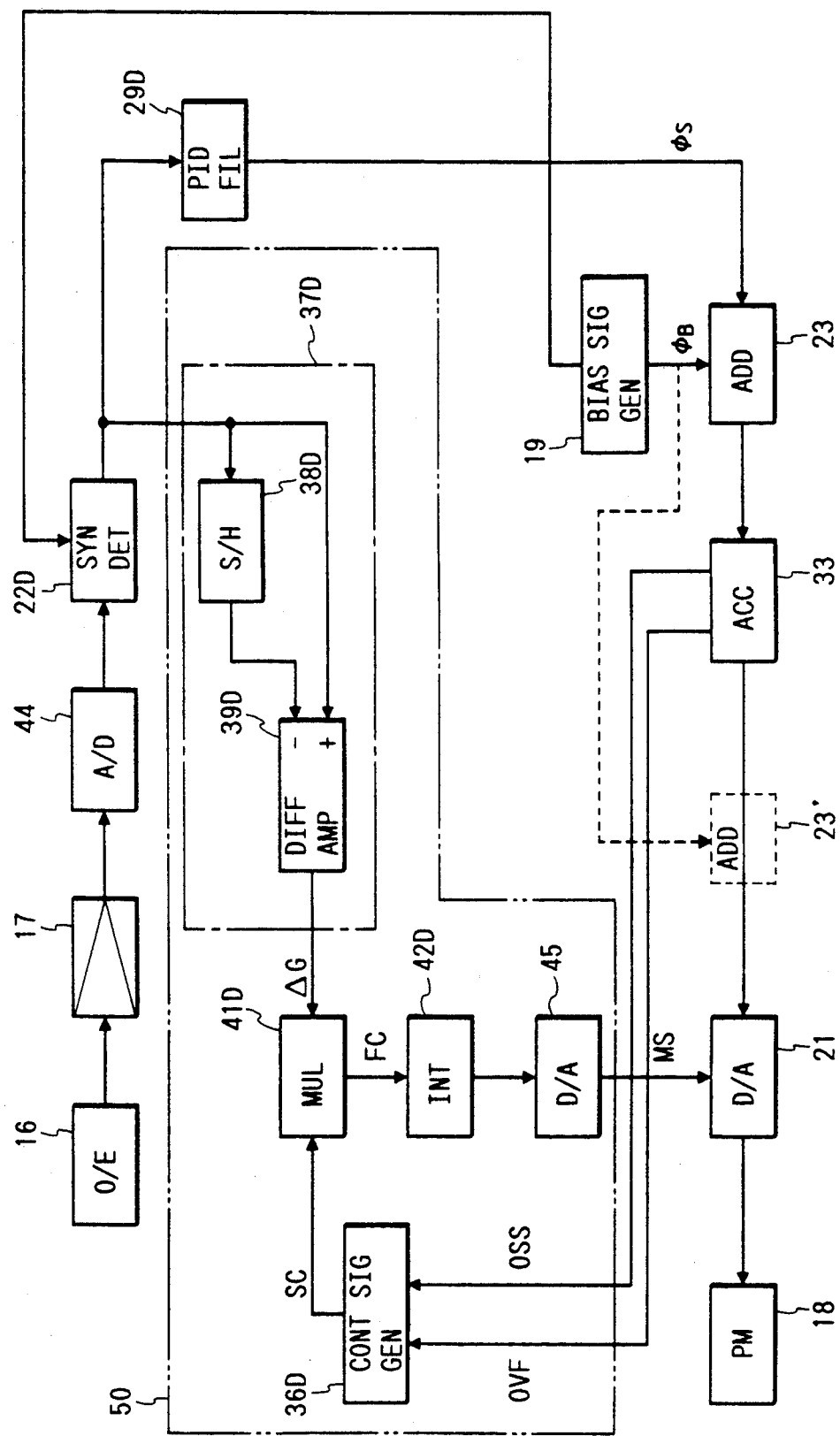
FIG. 9 is a block diagram showing an example in which the greater part of the FIG. 6 embodiment is digitized.

FIG. 9 illustrates a modified form of the FIG. 6 embodiment, in which an A/D converter 44 is provided at the stage following the AC amplifier 17 and the analog structure in FIG. 6 is replaced with a digital structure of the same function as that of the former. The parts of the same functions are identified by the same reference numerals suffixed with D. The output of the digital integrator 42D is converted by a D/A converter 45 to an analog signal, by which the gain of the D/A converter is controlled. In this way, signal processing from the output of the A/D converter 44 to the both inputs of the D/A converter 21 can be performed entirely by a computer.

Figure 10:
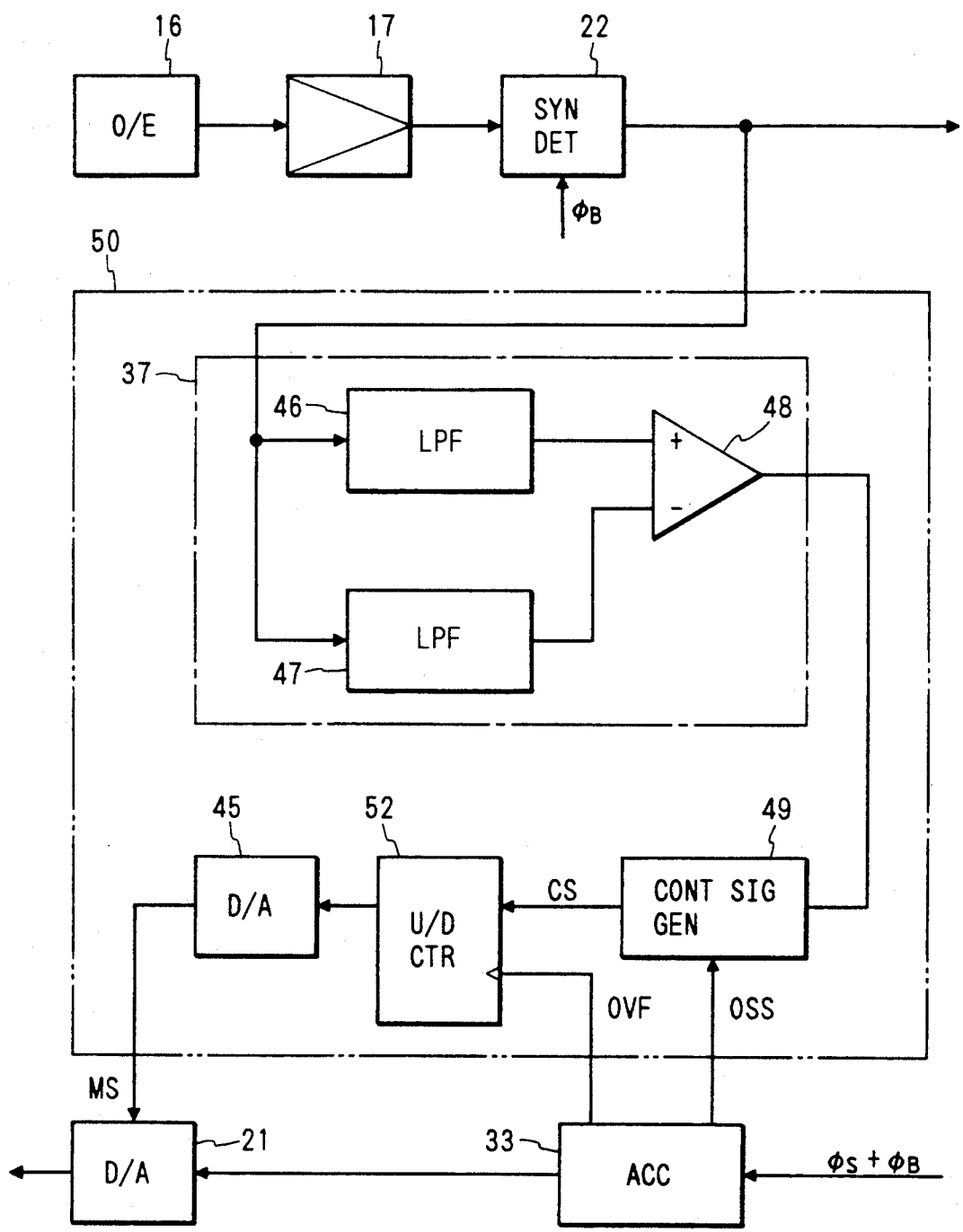
FIG. 10 is a block diagram illustrating the principal part of a modified form of the FIGS. 6 and 8 embodiments.

FIG. 10 illustrates a modified form of the conversion gain control circuit 50 for the D/A converter 21 in the embodiments of FIGS. 6 and 8. In FIG. 10 the parts corresponding to those in FIGS. 6 and 8 are indicated by the same reference numerals. In this example the output of the synchronous detector 22 is applied to first and second low-pass filters 46 and 47, the outputs of which are provided to non-inverting and inverting input ends of a comparator 48, respectively. The cutoff frequency of the first low-pass filter 46 is chosen to be higher than the cutoff frequency of the second low-pass filter 47. The output of the comparator 48 is provided to a control signal generator 49. The overflow sign signal OSS from the accumulator 33 is applied to the control signal generator 49. The control signal generator 49 outputs an inverted version of the output signal of the comparator 48 when the sign signal OSS represents a positive overflow and outputs the output signal of the comparator 48 intact when the sign signal OSS represents a negative overflow. An up-down counter 52 is controlled by the output CS of the control signal generator 49 to count upward or down and counts overflow signals (pulses). The count value of the up-down counter 52 is provided to the D/A converter 45.

The synchronous detector 22 operates in the same manner as described previously with respect to FIG. 6 and outputs a zero level or positive or negative DC level when the accumulator 33 does not overflow, but when it overflows, if the output level differs before and after the overflow, the synchronous detector 22 outputs a positive or negative pulse. Since the cutoff frequency of the first low-pass filter 46 is lower than the cutoff frequency of the second low-pass filter 47, the output waveform of the latter becomes greatly dull as compared with the output waveform of the former and the peak value of the former exceeds the peak value of the latter in terms of absolute value. When a positive pulse is provided at the output of the synchronous detector 22, the output of the comparator 48 goes high (H) and when a negative pulse is provided at the output of the synchronous detector 22, the output of the comparator 48 goes low (L). This means that the comparator 48 detects the magnitude and polarity of the outputs of the synchronous detector 22 before and after the overflow. In other words, the comparator 49 detects the polarity of the output pulse which is provided from the synchronous detector 22 when an overflow occurs.

In the case where the output of the comparator 48 is high when a positive overflow occurs, the control signal generator 49 outputs a down-count command, for example, a low level, and if the output of the comparator 48 is low, then the control signal generator 49 output an up-count command, for example, a high level. Consequently, when the operating point shifts from B to E in FIG. 5 in the case of the positive overflow, the comparator 48 provides the low-level output L and the counter 52 is put into the up-count state, in which its count value increases, causing an increase in the conversion gain of the D/A converter 21. When the operating point shifts from B to G at the time of the positive overflow, the comparator 48 outputs the high level H and the control signal generator 49 issues a down-count command. The counter 52 enters the down-count state, in which the count value decreases, reducing the conversion gain of the D/A converter 21. When the operating point shifts from A to L (or N) in the case of the positive overflow, the output of the AC amplifier 17 is synchronously detected by the $-\pi/2$ biasing signal $\phi_B$ (i.e. multiplied by $-1$) in the synchronous detector 22. In consequence, the comparator 48 outputs the low level L (or high level H), the control signal generator 49 issues the up-count command (or down-count command), the counter 52 counts upward (or down) and the conversion gain of the D/A converter 21 is increased (or decreased).

When the operating point shifts from A to F (or H) in the case of a negative overflow, the output of the AC amplifier 17 is synchronously detected by the $-\pi/2$ biasing signal $\phi_B$ (i.e. multiplied by $-1$) in the synchronous detector 22. Consequently, the comparator 48 outputs the high level H (or low level L), the control signal generator 49 issues the up-count command (or down-count command), the count value of the counter 52 increases (or decreases) and the conversion gain of the D/A converter 21 increases (or decreases). When the operating point shifts from B to K (or M) in the case of the negative overflow, the comparator 48 outputs the high level H (or low level L), the control signal generator 49 issues the up-count command (or down-count command), the count value of the counter 52 increases (or decreases) and the conversion gain of the D/A converter 21 increases (or decreases).

In short, the comparator 48 corresponds to the differential amplifiers 39 and 39D in the embodiments of FIGS. 6, 8 and 9, and the operation that when the positive overflow occurs, the control signal generator 49 provides an inverted version of the output of the comparator 48 to an up-down count control terminal of the up-down counter 52 corresponds to the operation that when the positive overflow occurs, the control signal generators 36 and 36D in FIGS. 6, 8 and 9 provides $-1$ to the multiplier 41 to reverse the direction of integration of the analog integrator 42. The low-pass filters 46 and 47 and the comparator 48 correspond to the conversion error signal detectors 37 and 37D, the control signal generator 49 corresponds to combinations of the control signal generators 36 and 36D and the multiplier 41D, and the counter 52 corresponds to the integrators 42 and 42D.

In FIGS. 6 and 9 the step value and the biasing signal are added together and then the added output is accumulated at the $k\tau$ time intervals, but it is also possible that the step value is accumulated first and is then added with the biasing signal $\phi_B$ in an adder 23' as indicated by the broken lines. In this instance, by using, as the biasing signal, a signal which provides phase shifts $+\pi/4$ and $-\pi/4$ rad between the both light beams 14 and 15 alternately at the $k\tau$ time intervals, phase differences $+\pi/2$ and $-\pi/2$ rad can be alternately provided between the light beams 14 and 15. Similarly, the FIG. 8 embodiment may also be modified so that the optical phase modulator 43 is omitted, the analog biasing signal $\phi_B$ is added to the output of the D/A converter 21 by an adder 23' and the added output is applied to the optical phase modulator 18 as indicated by the broken lines. The control of the conversion gain of the D/A converter 21 depicted in FIG. 10 is applicable to the case of using one optical phase modulator as in the FIG. embodiment and the case of using two optical phase modulators as in the FIG. 8 embodiment, and in the former the step value may also be added with the biasing signal after being accumulated. In FIG. 6 the step value may also be generated by a digital PID filter or similar digital calculator after the output of the synchronous detector 22 is A/D converted.

As described above, according to the present invention, by the provision of feedback control means which controls the conversion gain of the D/A converter 21 through use of an overflow sign signal representing the polarity of an overflow which occurs in the accumulator 33, the conversion gain of the D/A converter 21 can be controlled correctly even if the input angular rate is so large as to cause phase shifts in excess of $\pm\pi/2$ rad, and consequently, it is possible to measure such a large input angular rate. Moreover, two optical phase modulators can be provided and supplied with the biasing signal and the digital ramp signal independently of each other.

It will be apparent that many modifications and variations may be effected without departing from the scope of the novel concepts of the present invention.

What is claimed is:

1. A digital phase ramp type fiber optic gyro comprising:
   a light source;
   a beam splitter for splitting light from said light source to two light beams;

a loop-shaped optical transmission line through which said two light beams propagate as clockwise and counterclockwise light beams, respectively;

interference means whereby said clockwise and counterclockwise light beams emitted from said optical transmission line are caused to interfere with each other;

an opto-electric transducer which is supplied with interference light from said interference means and outputs an electric signal corresponding to the intensity of said interference light;

optical phase modulating means provided between one end of said optical transmission line and said beam splitter and electrically controlled, for shifting the phase of light;

biasing signal generating means for generating a biasing signal which is a square wave of a 50% duty and of a period twice longer than a time $k\tau$ which is an odd multiple of the time $\tau$ for the propagation of light through said optical transmission line, said biasing signal providing phase differences $+\pi/2$ rad and $-\pi/2$ rad between said clockwise and counterclockwise light beams alternately at $k\tau$ time intervals and k being a predetermined odd number equal to or greater than 1;

an AC amplifier for AC amplifying the output of said opto-electric transducer;

synchronous detector means for synchronously detecting the output of said AC amplifier by use of said biasing signal as a reference signal;

step value generating means which, based on the output of said synchronous detector means, generates a digital step value of a magnitude and a sign which cancel a Sagnac phase difference introduced between said clockwise and counterclockwise light beams by an angular rate applied to said optical transmission line;

biasing means which, based on said biasing signal, provides said phase differences $+\pi/2$ rad and $-\pi/2$ rad between said clockwise and counterclockwise light beams alternately at said $k\tau$ time intervals;

accumulator means which accumulates said digital step value at said $k\tau$ time intervals and outputs the accumulated output as a digital drive signal and, when the absolute value of said accumulated output exceeds a predetermined threshold value corresponding to $2m\pi$, outputs an overflow value as said accumulated output, an overflow signal representing the occurrence of the overflow and an overflow sign signal representing the polarity of said overflow, m being a predetermined integer equal to or greater than 1;

D/A converter means for converting said digital drive signal to an analog signal and for applying it as an analog drive signal to said optical phase modulating means;

conversion gain detector means for detecting, as a conversion error signal, a level change of the synchronously detected output of said synchronous detector means before and after the changeover of said biasing at said $k\tau$ time intervals;

negative feedback signal generating means which, when said overflow signal is provided, generates a negative feedback signal, based on said conversion error signal and a sign value corresponding to said overflow sign signal; and conversion gain control means for controlling the conversion gain of said D/A converter means, based on said negative feedback signal.

2. The fiber optic gyro of claim 1 wherein said biasing means includes adder means which adds together said biasing signal and said digital step value and provides the added output to said accumulator means.

3. The fiber optic gyro of claim 1 wherein said biasing means includes adder means which adds together said accumulated output and said biasing signal and provides the added output, as said digital drive signal, to said D/A converter means.

4. The fiber optic gyro of claim 1 wherein said biasing means includes a biasing phase modulator which is provided between one end of said optical transmission line and said beam splitter and controlled by said biasing signal to shift the phase of light.

5. The fiber optic gyro of claim 1 wherein said biasing means includes bias adding means which adds said biasing signal to said analog drive signal from said D/A converter means and provides the added output to said optical phase modulating means.

6. The fiber optic gyro of claim 3, 4, or 5 wherein said biasing signal generating means outputs, as said biasing signal, a signal which provides phase shifts $\pi/4$ rad and $-\pi/4$ rad between said clockwise and counterclockwise light beams alternately at said $k\tau$ time intervals.

7. The fiber optic gyro of claim 1, 2, 3, 4, or 5 wherein said conversion error detecting means includes sample-hold means for sampling and holding the output level of said synchronous detector means at the immediately preceding time $k\tau$ and level difference detecting means which detects a difference between the output level held in said sample-hold means and the output level of said synchronous detector means at said current $k\tau$ time and outputs said difference as said conversion error signal, wherein said negative feedback signal generating means includes control signal generating means which is supplied with said overflow signal and said overflow sign signal and which, when said overflow signal is not being produced, outputs a 0 and, when said overflow signal is being produced, outputs said sign value corresponding to said overflow sign signal and multiplying means which multiplies the output of said control signal generating means and said conversion error signal and outputs the multiplied output as said negative feedback signal, and wherein said conversion gain control means includes integrating means which integrates said negative feedback signal from said multiplying means and provides the integrated output as a multiplication signal to said D/A converter means.

8. The fiber optic gyro of claim 1, 2, 3, 4, or 5 wherein said conversion error detecting means includes means which detects the polarity of an output pulse of said synchronous detector means produced when said overflow occurs and which outputs, as said conversion error signal, a signal representing the polarity of said output pulse, wherein said negative feedback signal generating means includes control signal generating means which outputs an up-count or down-count command signal in accordance with the polarity of said output pulse represented by said conversion error signal and said sign value corresponding to said overflow sign signal, and wherein said conversion gain control means includes an up-down counter which responds to said up-count or down-count command signal to count said overflow signal upward or down and D/A converter means which converts the count value of said up-down counter to an analog signal and controls the conversion gain of said D/A converter means by said analog signal.

9. The fiber optic gyro of claim 8 wherein said conversion error detecting means includes first low-pass filter means which permits the passage therethrough of the output pulse of said synchronous detector means, second low-pass filter means which is supplied with the output of said synchronous detector means and has a cutoff frequency lower than that of said first low-pass filter means, and comparator means which compares the output levels of said first and second low-pass filter means and outputs the compared output as said conversion error signal.

* * * * *